US006736698B2

(12) United States Patent
Moore (10) Patent No.: US 6,736,698 B2
(45) Date of Patent: *May 18, 2004

(54) METHOD AND APPARATUS FOR WIRELESS TRANSFER OF CHEMICAL-MECHANICAL PLANARIZATION MEASUREMENTS

(75) Inventor: Scott E. Moore, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 207 days.

This patent is subject to a terminal disclaimer.

(21) Appl. No.: 09/853,067

(22) Filed: May 9, 2001

(65) Prior Publication Data

US 2001/0024929 A1 Sep. 27, 2001

Related U.S. Application Data

(62) Division of application No. 09/144,756, filed on Aug. 31, 1998.

(51) Int. Cl.[7] ................................................ B24B 1/00
(52) U.S. Cl. .................... 451/5; 451/6; 451/9; 451/10; 451/11; 451/286; 451/289
(58) Field of Search ............................. 451/5, 6, 9, 10, 451/11, 286, 289, 41, 287, 288; 438/692–693

(56) References Cited

U.S. PATENT DOCUMENTS 4,500,881 A    2/1985  Beane ................... 340/825.73
4,561,443 A   12/1985  Hogrefe et al.

(List continued on next page.)

FOREIGN PATENT DOCUMENTS

| EP | 0 408 015 A2 | 1/1991 |
| EP | 0 739 687 A2 | 10/1996 |
| WO | 98 05066 A | 2/1998 |

OTHER PUBLICATIONS

Internet Home Page for *MicroStrain*—www.microstrain.com.

Brochure; *StrainLink*; "Multichannel Strain Transmitter," Description and drawings.

*Primary Examiner*—George Nguyen
(74) *Attorney, Agent, or Firm*—Dorsey & Whitney LLP (57) ABSTRACT

A method and apparatus for the wireless transfer of measurements made during chemical-mechanical planarization of semiconductor wafers with a planarizing machine. The apparatus includes a sensor connected to the semiconductor substrate or a movable portion of the planarizing machine. The apparatus further comprises a display spaced apart from the sensor and a wireless communication link coupled between the sensor and the display to transmit a signal from the sensor to the display. The wireless communication link may include an infrared link, a radio link, an acoustic link, or an inductive link. The sensor may measure force, pressure, temperature, pH, electrical resistance or other planarizing parameters. The sensor may also detect light reflected from a reflective surface of a substrate that is used to calibrate the planarizing machine.

20 Claims, 8 Drawing Sheets

U.S. PATENT DOCUMENTS

| | | | |
|---|---|---|---|
| 5,213,655 A | | 5/1993 | Leach et al. |
| 5,240,552 A | * | 8/1993 | Yu et al. .................... 438/5 |
| 5,413,941 A | * | 5/1995 | Koos et al. .................. 438/16 |
| 5,433,651 A | | 7/1995 | Lustig et al. |
| 5,499,733 A | | 3/1996 | Litvak |
| 5,624,300 A | | 4/1997 | Kishii et al. |
| 5,643,050 A | | 7/1997 | Chen |
| 5,685,766 A | * | 11/1997 | Mattingly et al. ............ 451/36 |
| 5,762,537 A | | 6/1998 | Sandhu et al. ................. 451/7 |
| 5,791,969 A | | 8/1998 | Lund |
| 5,873,769 A | | 2/1999 | Chiou et al. |
| 5,876,265 A | * | 3/1999 | Kojima ........................ 451/10 |
| 5,877,088 A | * | 3/1999 | Samitsu et al. ............. 438/692 |
| 5,882,244 A | | 3/1999 | Hiyama et al. ................. 451/7 |
| 5,899,792 A | | 5/1999 | Yagi |
| 5,951,368 A | * | 9/1999 | Watanabe et al. ............... 451/5 |
| 5,964,643 A | | 10/1999 | Birang et al. |
| 6,007,408 A | | 12/1999 | Sandhu ........................ 451/41 |
| 6,010,538 A | * | 1/2000 | Sun et al. ............... 156/345.13 |
| 6,042,454 A | | 3/2000 | Watanabe et al. |
| 6,077,151 A | | 6/2000 | Black et al. ................... 451/53 |
| 6,095,898 A | | 8/2000 | Hennhofer et al. ............. 451/7 |
| 6,110,752 A | | 8/2000 | Litvak |
| 6,170,149 B1 | | 1/2001 | Oshiki et al. |
| 6,352,466 B1 | * | 3/2002 | Moore .......................... 451/5 |
| 6,413,147 B1 | | 7/2002 | Litvak |

\* cited by examiner

METHOD AND APPARATUS FOR WIRELESS TRANSFER OF CHEMICAL-MECHANICAL PLANARIZATION MEASUREMENTS

CROSS-REFERENCE TO RELATED APPLICATION

This application is a divisional of pending U.S. patent application Ser. No. 09/144,756, filed Aug. 31, 1998.

TECHNICAL FIELD

The present invention relates to methods and devices for the wireless transfer of measurements made during chemical-mechanical planarization of semiconductor wafers.

BACKGROUND OF THE INVENTION

Figure 1:
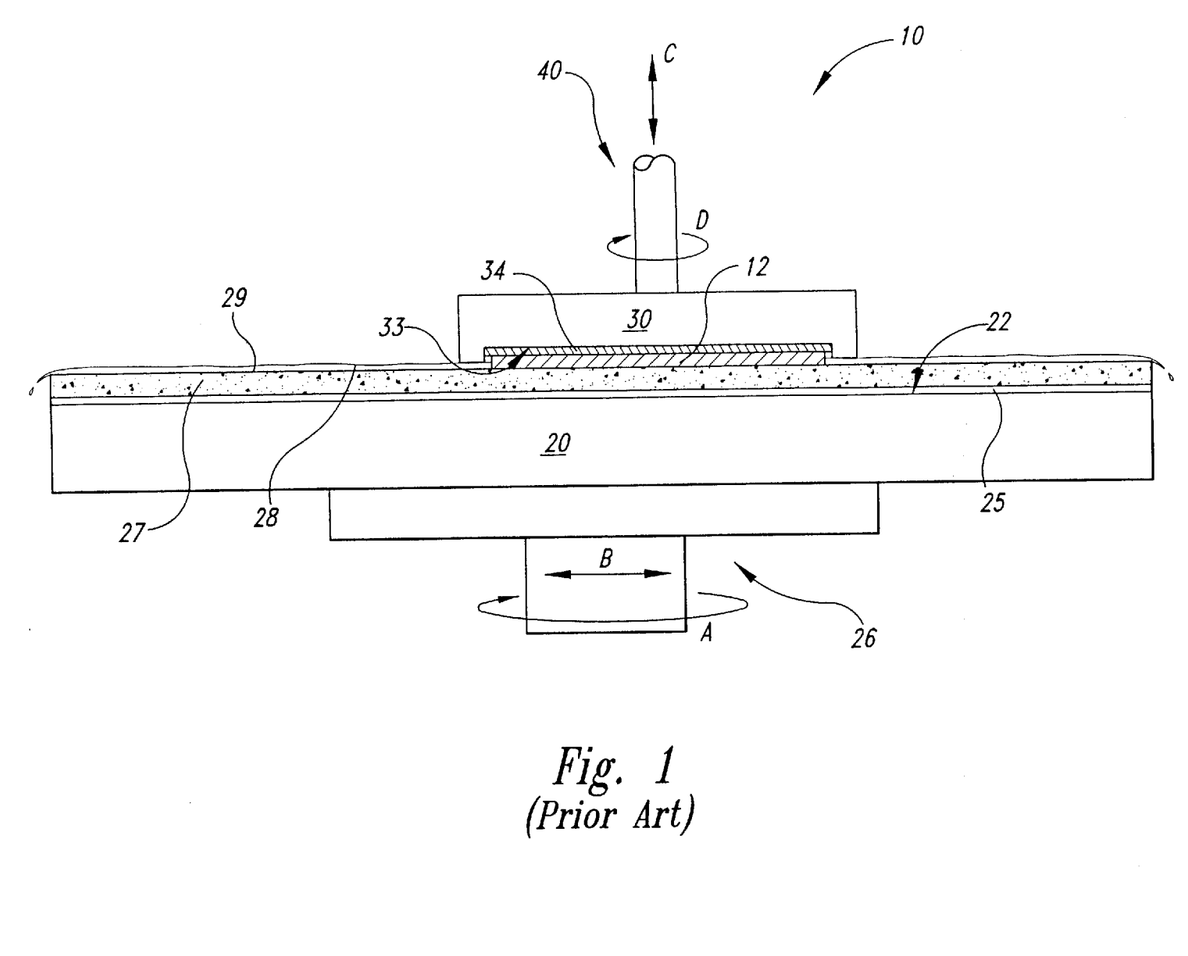
FIG. 1 is a partial cross-sectional elevation view of a chemical-mechanical planarization machine in accordance with the prior art.

Chemical-mechanical planarization ("CMP") processes remove material from the surface of a semiconductor wafer in the production of integrated circuits. FIG. 1 schematically illustrates a CMP machine 10 with a platen 20, a wafer carrier 30, a polishing pad 27, and a planarizing liquid 28 on the polishing pad 27. The polishing pad 27 may be a conventional polishing pad made from a continuous phase matrix material (e.g., polyurethane), or it may be a new generation fixed abrasive polishing pad made from abrasive particles fixedly dispersed in a suspension medium. The planarizing liquid 28 may be a conventional CMP slurry with abrasive particles and chemicals that etch and/or oxidize the wafer, or the planarizing liquid 28 may be a planarizing solution without abrasive particles that contains only chemicals to etch and/or oxidize the surface of the wafer. In most CMP applications, conventional CMP slurries are used on conventional polishing pads, and planarizing solutions without abrasive particles are used on fixed abrasive polishing pads.

The CMP machine 10 also has an underpad 25 attached to an upper surface 22 of the platen 20 and the lower surface of the polishing pad 27. In one type of CMP machine, a drive assembly 26 rotates the platen 20 as indicated by arrow A. In another type of CMP machine, the drive assembly 26 reciprocates the platen 20 back and forth as indicated by arrow B. Since the polishing pad 27 is attached to the underpad 25, the polishing pad 27 moves with the platen 20.

The wafer carrier 30 has a lower surface 33 to which a wafer 12 may be attached, or the wafer 12 may be attached to a resilient pad 34 positioned between the wafer 12 and the lower surface 33. The wafer carrier 30 may be a weighted, free-floating wafer carrier, or an actuator assembly 40 may be attached to the wafer carrier to impart axial and/or rotational motion (indicated by arrows C and D, respectively).

To planarize the wafer 12 with the CMP machine 10, the wafer carrier 30 presses the wafer 12 face-downward against the polishing pad 27. While the face of the wafer 12 presses against the polishing pad 27, at least one of the platen 20 or the wafer carrier 30 moves relative to the other to move the wafer 12 across the planarizing surface 29. As the face of the wafer 12 moves across the planarizing surface 29, the polishing pad 27 and the planarizing liquid 28 continually remove material from the face of the wafer 12.

CMP processes must consistently and accurately produce a uniform, planar surface on the wafer to enable precise circuit and device patterns to be formed with photolithography techniques. As the density of integrated circuits increases, it is often necessary to accurately focus the critical dimensions of the photo-patterns to within a tolerance of approximately 0.1 $\mu$m. Focusing photo-patterns of such small tolerances, however, is difficult when the planarized surface of the wafer is not uniformly planar. Thus, CMP processes must create a highly uniform, planar surface.

One problem with CMP processing is that the planarized surface of the wafer may not be sufficiently uniform across the whole surface of the wafer. The uniformity of the planarized surface is a function of several variables, including the pressure between the wafer and the planarizing surface, the temperature of the wafer and/or the planarizing surface, and the temperature and pH of the planarizing liquid. One conventional approach to addressing this problem has been to measure some or all of the above variables and adjust the CMP processing conditions to improve the uniformity of the wafers. This approach has created additional problems. For example, if the measurements are made while the CMP machine is stationary, they may not be representative of the actual conditions present during planarization. On the other hand, if sensors are placed on the wafer carrier to make measurements during planarization, mechanical means, such as slip rings and the like may be required to transmit electrical signals from the moving sensors to a stationary display.

One conventional approach for obtaining in situ measurements is to use remote sensing means. For example, an infrared gun may be used to measure the temperature of the wafer during planarization. This approach suffers from several drawbacks. One drawback is that the temperature readings obtained from the infrared gun may be distorted by the presence of the planarizing liquid. A second drawback is that remote sensing means may not be readily available for some types of sensors, for example, pressure transducers. Accordingly, it may be difficult to determine the pressure between the wafer and the polishing pad during planarization.

One conventional approach for obtaining in situ pressure measurements is to place the pressure transducer on a mechanical linkage between the wafer carrier and a fixed reference point. This approach may suffer from still further drawbacks. For example, the weight of the mechanical linkage may distort the pressure measurement, and the linkage itself may have such a high inertia that it is unable to respond quickly to sudden pressure changes.

Still a further drawback with the foregoing conventional approaches is that each approach may require that a sensor and associated peripheral hardware be installed on a large number of CMP machines, although the planarizing characteristics may need to be monitored only periodically. As a result, the cost for sensors, peripheral hardware, and maintenance may be higher than is necessary.

In the competitive semiconductor industry, it is also desirable to maximize the throughput of finished wafers. One factor that affects the throughput of CMP processing is the ability to accurately stop planarizing a given wafer or type of wafers at a desired endpoint. To determine whether a wafer is at its desired endpoint, conventional CMP processes typically stop planarizing the wafer and measure the change in thickness of the wafer with an interferometer or other distance measuring device. If the wafer is underplanarized, CMP processing is resumed and the wafer is periodically measured until the wafer reaches its desired endpoint. If the wafer is over-planarized, the wafer may be partially or fully damaged. The throughput of finished wafers is accordingly greatly affected by the ability to accurately and quickly determine the endpoint of individual wafers and/or types of wafer.

SUMMARY OF THE INVENTION

The present invention is directed toward a method and apparatus for the wireless transfer of measurements made during chemical-mechanical planarization of a semiconductor substrate with a planarizing device. The planarizing device may have a support, a platen assembly connected to the support, and a carrier movable relative to the platen assembly and the support to remove material from a semiconductor substrate positioned between the carrier and the platen assembly. In one embodiment, the apparatus may comprise a sensor connected to the platen assembly, the carrier, or the semiconductor substrate. The sensor generates a signal corresponding to a value of a selected property of the planarizing device or the semiconductor substrate. For example, the property may be a force exerted against the semiconductor substrate by the carrier, a temperature or resistance of the semiconductor substrate, or the pH of planarizing liquid surrounding the semiconductor substrate. The apparatus may further include a display spaced apart from the sensor and a wireless communication link coupled between the sensor and the display to transmit the signal from the sensor to the display. The wireless communication link may include an infrared, radio, or acoustic transmitter and receiver, or a pair of inductors.

In one embodiment, the signal may be transmitted in real time from the sensor to the display. In another embodiment, the signal may be stored and then transmitted in a batch manner, and the communication link may include a cable or the wireless means described above. In still another embodiment, the apparatus may include a feedback loop that changes the selected property based on the signal generated by the sensor.

In yet another embodiment of the invention, the apparatus may remove material from a substrate having a reflective layer and a transparent surface opposite the reflective layer. The apparatus may include a light source positioned to illuminate the substrate, and a light sensor positioned to detect the presence or absence of light reflected from the reflective layer through the transparent surface of the substrate. In a further aspect of this embodiment, the reflective layer may have a hardness approximately the same as the hardness of a semiconductor wafer so that removal of the reflective layer is representative of semiconductor wafer planarization.

DETAILED DESCRIPTION OF THE INVENTION

The present invention is directed toward methods and apparatuses for transmitting data from a chemical-mechanical planarization machine. The apparatus may include a wireless communication link to transmit the data from a movable portion of the machine to a fixed point. Many specific details of certain embodiments of the invention are set forth in the following description and in FIGS. 1–10 to provide a thorough understanding of such embodiments. One skilled in the art, however, will understand that the present invention may have additional embodiments and that they may be practiced without several of the details described in the following description.

Figure 2:
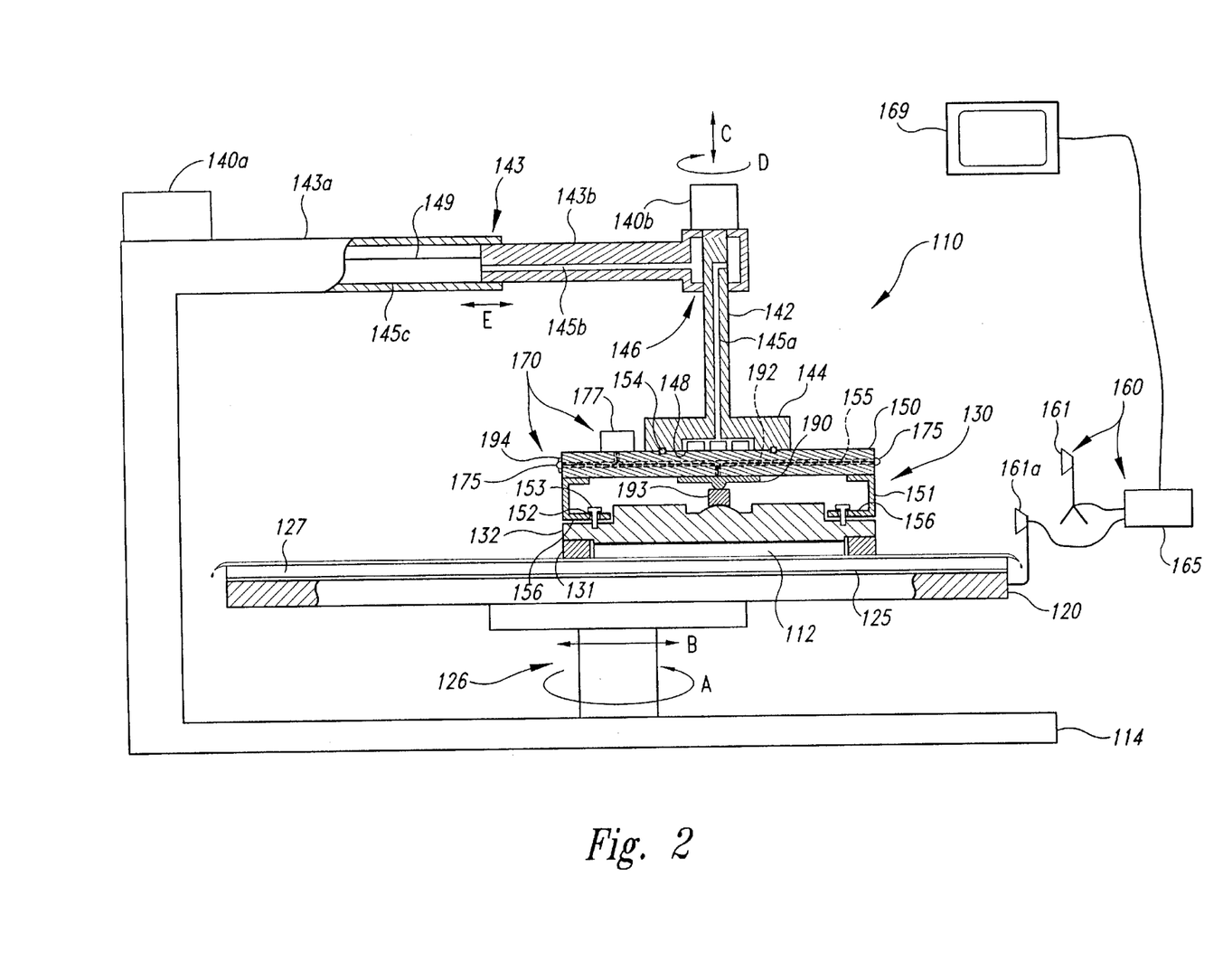
FIG. 2 is a partial cross-sectional elevation view of an apparatus in accordance with an embodiment of the present invention.

FIG. 2 illustrates a CMP apparatus 110 for measuring the values of one or more parameters associated with chemical-mechanical planarization of a semiconductor substrate or wafer 112. As discussed above with respect to FIG. 1, the apparatus 110 has a platen 120, an underpad 125 mounted to the top surface of the platen 120, and a polishing pad 127 mounted to the top surface of the underpad 125. The platen 120 may be movable relative to a fixed support structure 114 by means of a drive assembly 126 that may impart rotational motion (indicated by arrow A) and/or translational motion (indicated by arrow B) to the platen 120.

The apparatus 110 may also include a carrier assembly 130 that engages the semiconductor substrate 112 and moves the semiconductor substrate relative to the polishing pad 127 to remove material therefrom. A retainer ring 131 prevents the semiconductor substrate 112 from sliding away from the carrier assembly 130. The carrier assembly 130 is supported relative to the polishing pad 127 by a horizontal support arm 143 and a vertical drive shaft 142. The horizontal support arm 143 may include outer and inner telescoping segments 143a and 143b. The outer telescoping segment 143a is attached to the support structure 114, and the inner telescoping segment 143b may slide relative to the outer telescoping segment 143a as indicated by arrow E, to oscillate the carrier assembly 130 in a horizontal direction. In one embodiment, the inner telescoping segment 143b and carrier assembly 130 are driven by an actuator 140a and a linkage 149, and in other embodiments, other means oscillate the carrier assembly 130.

The drive shaft 142 extends between the inner telescoping segment 143b and the carrier assembly 130. The drive shaft 142 may be coupled to an actuator 140b that imparts to the carrier assembly 130 a vertical motion, indicated by arrow C, and/or a rotational motion, indicated by arrow D. The driveshaft 142 further includes a coupling member or plate 144 that has a plurality of vacuum apertures 148 to releasably engage the carrier assembly 130. The vacuum apertures 148 are coupled to a vacuum source (not shown) by a series of connecting conduits 145 (shown in FIG. 2 as 145a, 145b, and 145c) that pass through the drive shaft 142 and the support arm 143. A rotational seal 146 at the junction between the support arm 143 and the drive shaft 142 connects the rotating portion of the conduit 145a to the translating portions of the conduit 145b and 145c.

The carrier assembly 130 includes a mounting member or plate 150 coupled to the coupling plate 144 and an engaging member or plate 132 that engages the semiconductor substrate 112. The mounting plate 150 has a smooth upper surface and an O-ring 154 to provide a gas-tight seal with the coupling plate 144. When a vacuum is drawn through the vacuum apertures 148 by the vacuum source, the coupling plate 144 may firmly engage the mounting plate 150.

The engaging plate 132 is positioned beneath the mounting plate 150 and is coupled to the mounting plate 150 by a spacer ring 151 and a vertical coupling 193. The spacer ring 151 is attached to a lower surface of the mounting plate 150 and extends around the periphery of the mounting plate toward the engaging plate 132. The spacer ring 151 has a plurality of circular apertures 152 in a lower flange 156 thereof. Bolts 153 extend through the apertures 152 and bear against the walls of the apertures to impart rotational motion from the drive shaft 142 to the engaging plate 132. The lower flange 156 of the spacer ring 151 is spaced apart from the engaging plate 132 so that the spacer ring 151 transmits no vertical force to the engaging plate 132. Instead, all vertical forces are transmitted to the engaging plate 132 and the semiconductor substrate 112 through the vertical coupling 193.

In one embodiment, a force sensor 190 is positioned between the vertical coupling 193 and the mounting plate 150. In other embodiments, the force sensor 190 may be positioned in other portions of the apparatus 110, so long as it is in the load path between the actuator 140b and the semiconductor substrate 112, and is sufficiently close to the semiconductor substrate 112 to accurately measure the vertical forces transmitted thereto. The force sensor 190 may be one of a variety of commercially available transducers configured to measure steady state and/or variable forces and generate a corresponding electrical signal. A calibrator 194 may be attached to the mounting plate 150 and coupled to the force sensor 190 to calibrate the electrical signal with a known value.

The force sensor 190 is connected to a transmitter assembly 170 that generates wireless signals corresponding to the force sensor signals. The wireless signals are transmitted by a transmitter 177 to one or more transmitting transducers 175 and then to a receiver assembly 160. The receiver assembly 160 includes a receiving transducer 161 positioned to receive the wireless signals, and a receiver 165 coupled to the receiving transducer 161. The receiver assembly 160 is coupled to an electronic device 169. In one embodiment, shown in FIG. 2, the electronic device 169 may include a display that displays the signals in a human readable format. In other embodiments, the electronic device 169 may include a chart recorder, printer, or other output device. In still further embodiments, the electronic device 169 may include other devices, such as a feedback device, as is discussed in greater detail below with reference to FIG. 6. In any case, the transmitter assembly 170 and the receiver assembly 160 together form a wireless communication link between the force sensor 190 and the electronic device 169.

Figure 3:
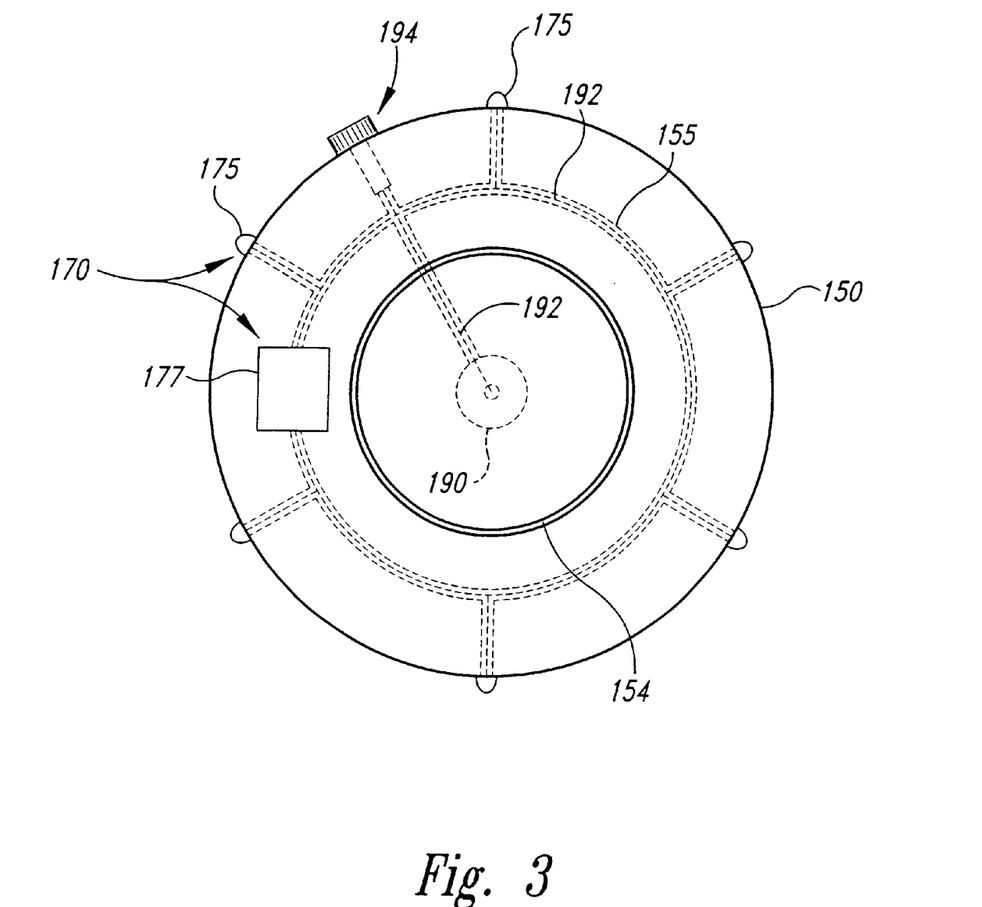
FIG. 3 is a top plan view of a portion of the apparatus shown in FIG. 2.

FIG. 3 is a top plan view of the mounting plate 150 and the transmitter assembly 170 shown in FIG. 2. Referring to FIGS. 2 and 3, several transmitting transducers 175 are coupled to the transmitter 177 with cables 192 routed through cable passages 155 in the mounting plate 150. Accordingly, even where the signals emitted by the transmitting transducers 175 travel in generally straight lines, the signals emitted by at least one of the transmitting transducers 175 will be coupled to the receiving transducer 161 (FIG. 2) at all times.

The transmitting transducers 175 and the receiving transducer 161 may transmit wireless signals by one or more of several means. For example, in one embodiment, the transmitting transducers 175 and the receiving transducers 161 may generate and receive, respectively, optic signals, such as infrared, ultraviolet, or visible light signals. In one aspect of this embodiment, the transmitting transducer 175 can include a light source and a waveguide, such as a fiber optic cable, having an emission point from which optic signals are emitted. In other embodiments, the transmitting transducer 175 may include other types of waveguides. In still further embodiments, the transmitting transducers 175 and the receiving transducers 161 may generate and receive, respectively, radio signals or acoustic signals, for example, subsonic, sonic, or ultrasonic signals. In yet another embodiment, the transmitting transducers 175 may include inductors that generate magnetic signals and the receiving transducer 161 may include a corresponding inductor to receive the magnetic signal.

Returning to FIG. 2, the transmitting transducers 175 may be spaced apart from the receiving transducer 161 in each of the foregoing embodiments, and may be movable relative to the receiver assembly 160 without interrupting the flow of signals therebetween. In the embodiment shown in FIG. 2, the transmitter assembly 170 may be attached to the mounting plate 150. In other embodiments, the transmitter assembly 170 may be attached to any portion of the apparatus 110 that moves relative to the electronic device 169, such as the platen 120 or the semiconductor substrate 112. The receiving transducer 161 may be positioned adjacent the support structure 114, as shown in FIG. 2, or, as is also shown in FIG. 2, a receiving transducer 161a may be positioned on the platen 120 where the platen 120 does not move relative to the electronic device 169. In still further embodiments, the receiving transducer 161 may be positioned on any portion of the apparatus that is generally fixed relative to the electronic device 169. In any of the foregoing embodiments, the receiving transducer 161 may include a parabolic horn to receive even relatively weak signals generated by the transmitting transducer 175, reducing the power required by the transmitter 177.

Figure 4A:
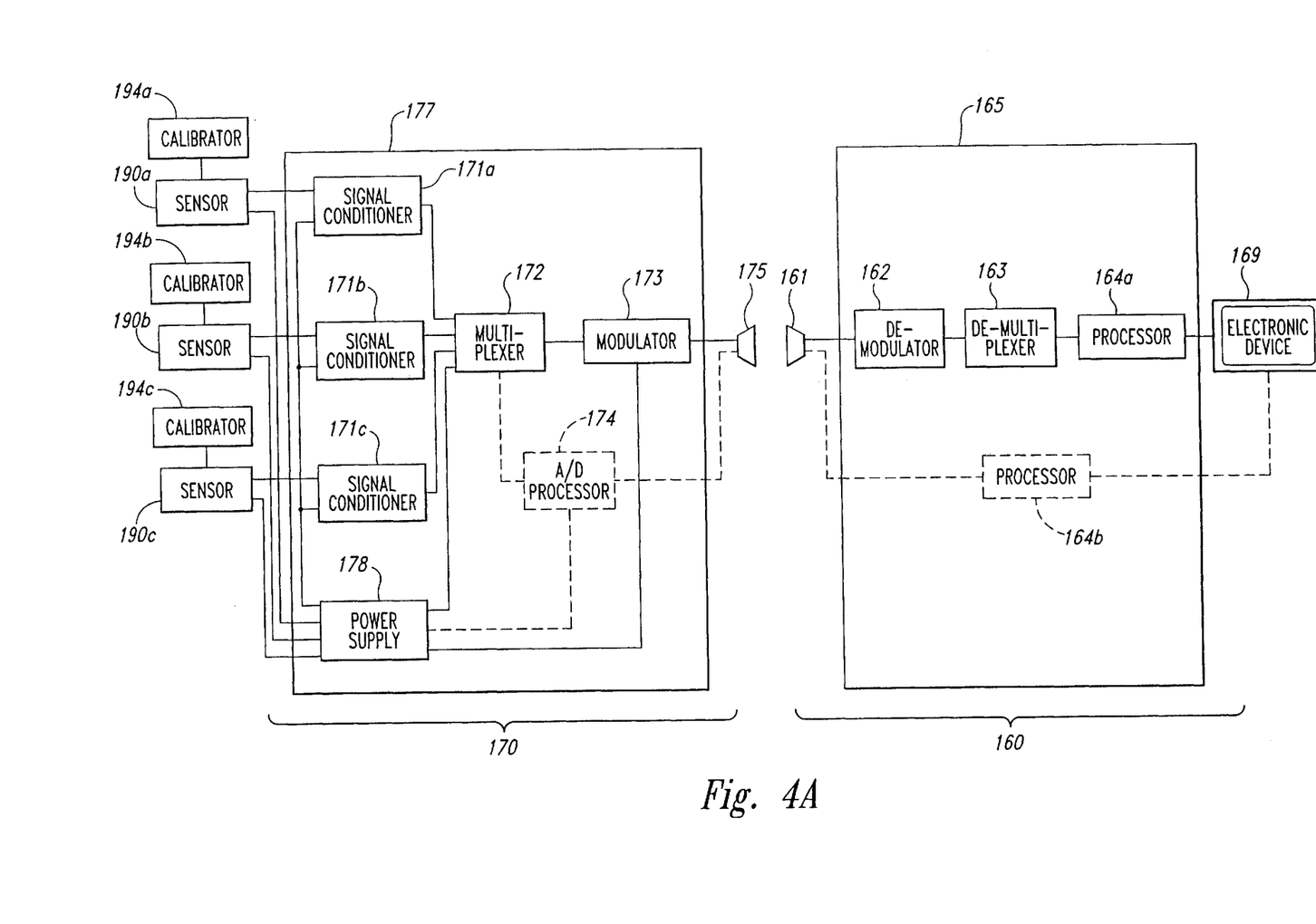
FIG. 4A is a block diagram of a transmitter assembly and a receiver assembly in accordance with an embodiment of the invention.

FIG. 4A is a schematic block diagram of a transmitter assembly 170 and receiver assembly 160 in accordance with an embodiment of the invention. The transmitter assembly 170 is configured to transmit signals from several sensors 190 (shown as 190a, 190b, 190c) that may be calibrated with a corresponding plurality of calibrators 194 (shown as 194a, 194b, and 194c). Each sensor 190 is coupled to a signal conditioner 171 (shown as 171a, 171b, and 171c) to reduce noise in the signals generated by the sensors 190. The conditioned signals are then transmitted to a multiplexer 172, that samples each signal stream and compiles a single composite signal stream.

In one embodiment, the composite signal stream proceeds from the multiplexer 172 to a modulator 173 that modulates either the frequency or the amplitude of the signal stream. In another embodiment, the modulator 173 may be replaced with an A/D processor 174, as shown in dashed lines in FIG. 4A. The A/D processor 174 may include a converter, a central processing unit or discrete logic device, a storage device and/or a control code unit, and transforms the analog signal from the multiplexer 172 to a bit stream which is then conveyed to the transmitting transducer 175. The multiplexer 172, A/D processor 174, and transducer 175 may comprise a commercially available unit, such as a Microstamp system available from Micron Technology, Inc. of Boise, Id., or a Strain Link™ system available from Microstrain of Burlington, Vt.

The transmitter assembly 170 further includes a power supply 178 coupled to the sensors 190, the signal conditioners 171 and any other components requiring power, such as the multiplexer 172, the modulator 173, and the A/D processor 174. In one embodiment, the power supply 178 may include a battery. In another embodiment, the power supply may include a solar cell or other device that does not require external cable connections during planarization, for example, a first inductor that is magnetically or electromagnetically coupled to a corresponding second inductor to generate electrical current.

The signal transmitted by the transmitting transducer 175 is received by the receiving transducer 161, as discussed above with reference to FIGS. 2 and 3. Where the signal is an analog signal, the receiving transducer 161 is coupled to a demodulator 162 to convert the signal to a voltage, then to a demultiplexer 163 to separate individual signals from the signal stream, and then to a processor 164a. The processor 164a may convert the voltage to a human readable format where the electronic device 169 is a display. Where the signal emitted by the transmitting transducer 175 is a digital signal, the demodulator 162 and demultiplexer 163 are replaced by a processor 164b, as shown in dashed lines in FIG. 4A.

An advantage of the apparatus 110 shown in FIGS. 2–4A is that it easily transmits force data from a rotating and translating portion of the apparatus to the fixed electronic device 169 without the need for slip rings or other mechanical devices. Accordingly, the apparatus 110 may be less complex than conventional apparatuses and may be less susceptible to mechanical failure. Another advantage of the apparatus 110 shown in FIGS. 2–4A is that it transmits real-time or nearly real-time force data because the communication link includes radio, infrared, or magnetic transmitters and receivers. As a result, the signals are not delayed or otherwise hampered by mechanical linkages. This may be especially important for transmitting vibration measurements, which may have such a high frequency that they are not accurately transmitted by mechanical means.

Still another advantage of the apparatus 110 shown in FIGS. 2–3 is that the carrier assembly 130 may be easily removed from the apparatus 110 and moved to another CMP machine. The receiver assembly 160 and electronic device 169 may also be easily moved from one machine to another. Accordingly, the force sensor 190 may be used periodically to run diagnostic checks of individual CMP machines without the need to simultaneously outfit each machine with a complete transmitter assembly 170 and receiver assembly 160.

Figure 4B:
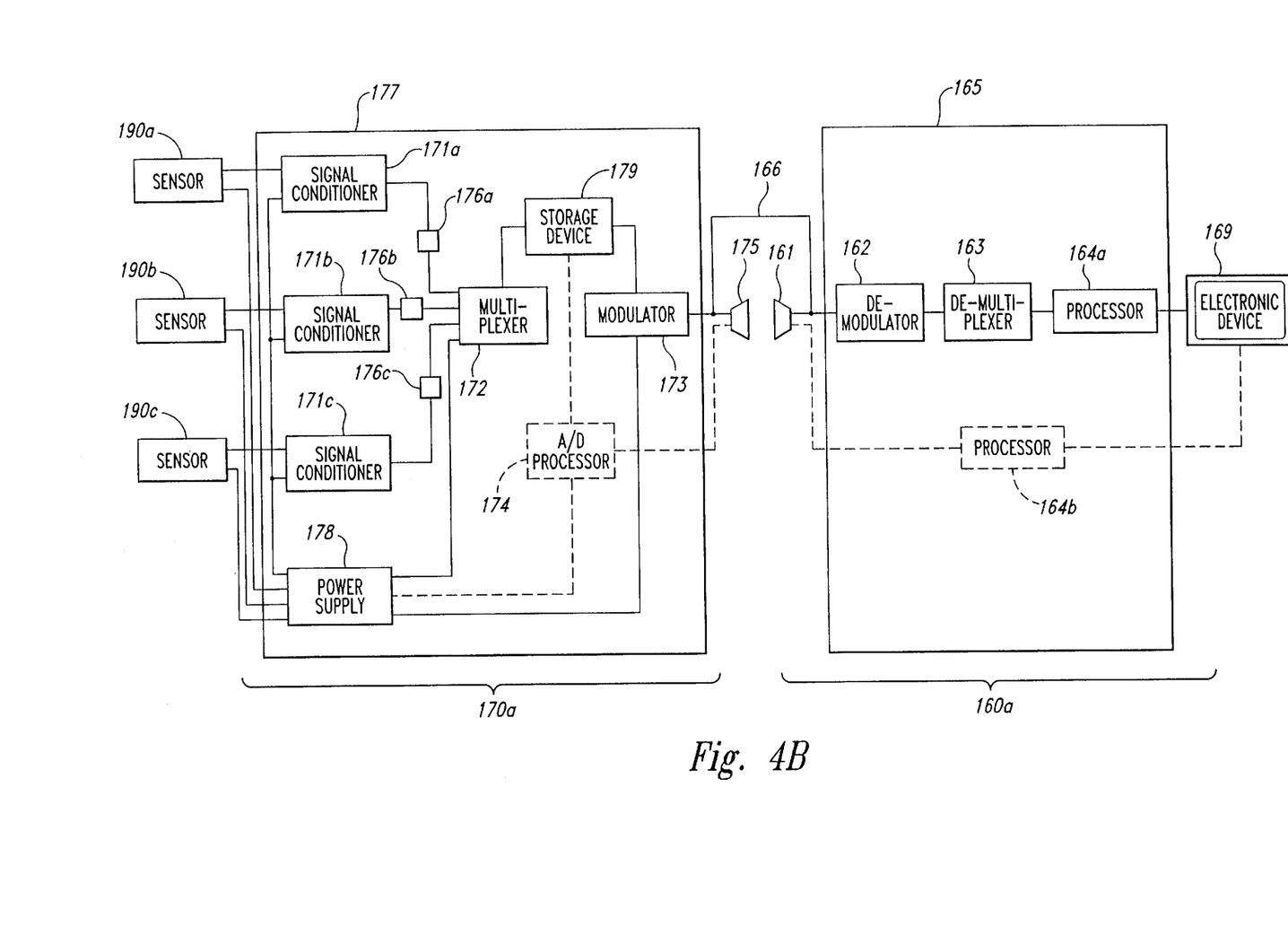
FIG. 4B is a block diagram of a transmitter assembly and a receiver assembly in accordance with another embodiment of the invention.

FIG. 4B is a schematic block diagram of a receiver assembly 160a and a transmitter assembly 170a in accordance with another embodiment of the invention. As shown in FIG. 4B, the receiver assembly 160a is generally similar to the receiver assembly shown in FIGS. 2–4A. The transmitter assembly 170a is generally similar to the transmitter assembly 170 shown in FIGS. 2–4A; however, it further includes a storage or memory device 179 coupled to the multiplexer 172. The storage device 179 may be used to store data received from the sensors 190 and transmit the data to the transducer 175 in a batch format. In one embodiment, for example, the carrier assembly 130 (FIG. 2) may be halted prior to conveying the data from the sensor 190 to the electronic device 169. In one aspect of this embodiment, the transducers 175 and 161 may be replaced by a cable 166 that is coupled between the transmitter assembly 170a and the receiver assembly 160a while the data is transmitted. The cable 166 may be removed after the data has been transmitted and before resuming motion of the carrier assembly 130. An advantage of the transmitter assembly 170a shown in FIG. 4B when compared with the transmitter assembly 170 shown in FIG. 4A is that it may eliminate the need for the transducers 175 and 161. Conversely, an advantage of the transmitter assembly 170 shown in FIG. 4A is that it is configured to transmit real-time data rather than batch data.

Figure 5:
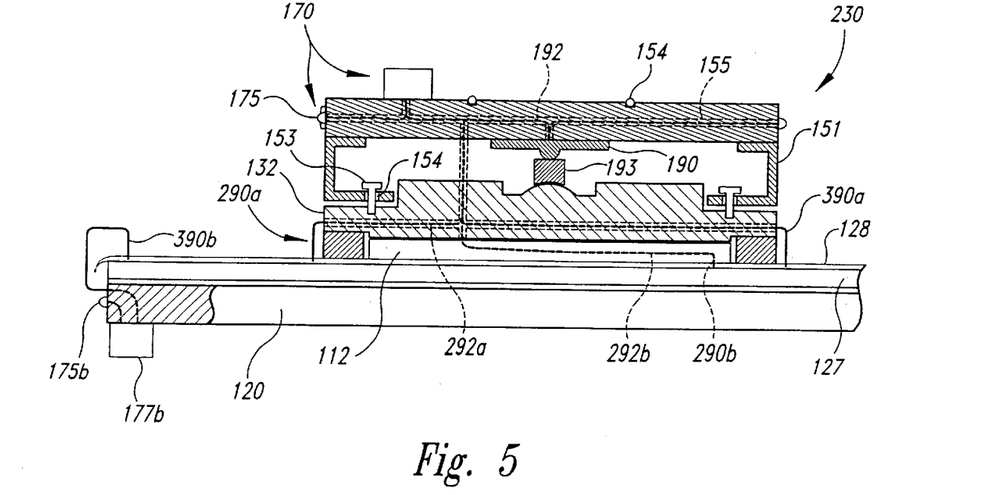
FIG. 5 is a partial cross-sectional elevation view of a carrier assembly in accordance with another embodiment of the invention.

FIG. 5 is a partial cross-sectional elevation view of a carrier assembly 230 having sensors in accordance with another embodiment of the invention. In addition to the force sensor 190 discussed above with reference to FIGS. 2–4B, the carrier assembly 230 may include temperature sensors 290 (shown as 290a and 290b) and pH sensors 390 (shown as 390a and 390b). One temperature sensor 290a may include a conventional thermocouple device that extends from the engaging plate 132 toward the polishing pad 127 and/or the planarizing liquid 128 and is coupled to the transmitter assembly 170 by leads 292a. The other temperature sensor 290b may be integrated with a surface of the semiconductor substrate 112 to measure the temperature of the semiconductor substrate directly, and may be coupled to the transmitter assembly 170 by conventional leads 292b or by conventional leads in combination with vias in the structure of the semiconductor substrate 112.

The pH sensors 390 may include a conventional electronic pH meter such as is available from PGC Scientific of Gaithersburg, Md., or Beckman Instruments of Fullerton, Calif. In one embodiment, shown in FIG. 5, one pH sensor 390a may be attached to the carrier assembly 230. In another embodiment, also shown in FIG. 5, another pH sensor 390b may be attached to the platen 120, and may be coupled to a transmitter 177b and transmitting transducer 175b, also attached to the platen 120. In still further embodiments, the carrier assembly 230 and/or the platen 120 may include other sensors to measure the values of other parameters related to CMP processes, so long as the measurements may be converted to wireless signals.

An advantage of the temperature sensors 290 and the pH sensors 390 shown in FIG. 5 is that they may be used to obtain additional diagnostic data during the planarization process. The signals generated by the sensors may be transmitted in real-time, as is generally shown in FIG. 4A, or may be stored and transmitted in a batch fashion, as is shown in FIG. 4B. Data from different types of sensors (e.g., force, temperature, pH) and/or data from a plurality of sensors of the same type (e.g., several force sensors) may be transmitted in a single data stream by using a multiplexer 172, as is generally shown in FIG. 4A.

Figure 6:
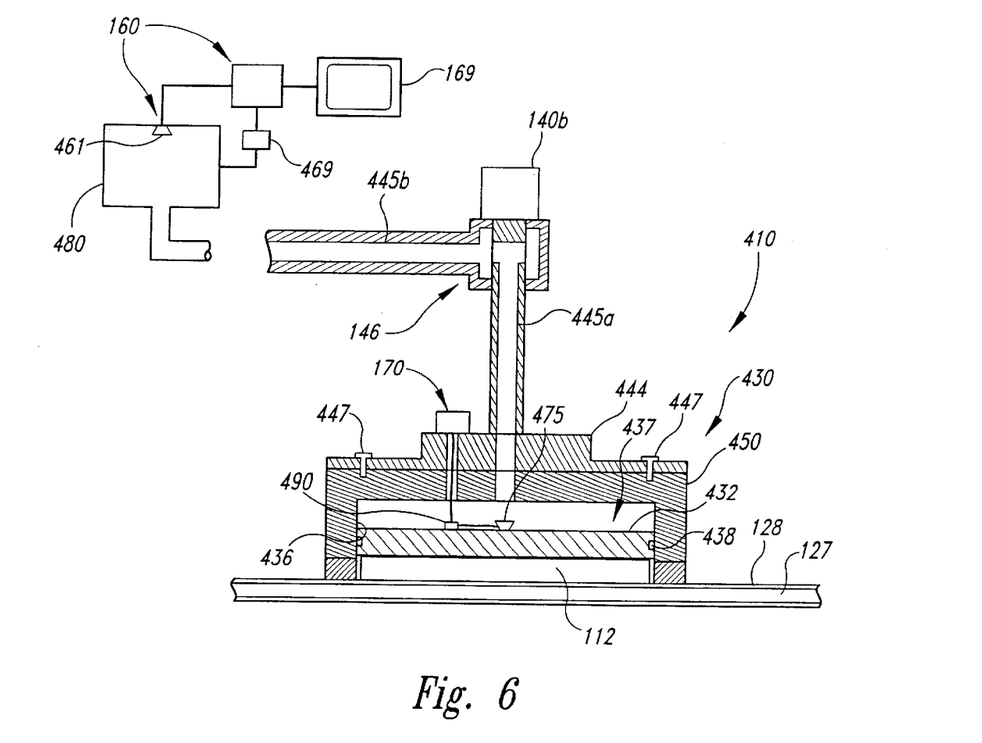
FIG. 6 is a partially schematic, partial cross-sectional elevation view of an apparatus in accordance with still another embodiment of the invention.

FIG. 6 is a cross-sectional elevation view of an apparatus 410 having an acoustic transmitting transducer 475, such as an audio speaker, and an acoustic receiving transducer 461, such as an audio microphone, in accordance with another embodiment of the invention. As shown in FIG. 6, the carrier assembly 430 includes a mounting member 450 removably attached with bolts 447 to the coupling plate 444. The mounting member 450 includes a cylinder 437 having cylinder walls 436 configured to slidably receive the engaging member 432. The engaging member 432 includes an O-ring 438 that sealably engages the cylinder walls 436 and is slidable within the cylinder 437 to press the semiconductor substrate 112 into engagement with the polishing pad 127. The apparatus 410 further includes a pressurized air source 480 coupled with conduits 445a and 445b to the cylinder 437. The air pressure within the cylinder 437 may be adjusted with the air source 480 to a desired level, thus establishing a desired force between the semiconductor substrate 112 and the polishing pad 127.

As shown in FIG. 6, a pressure transducer 490 is configured to measure the air pressure within the cylinder 437 and transmit the measurement to the transmitter assembly 170 and the acoustic transmitting transducer 475. The acoustic signal emitted by the acoustic transmitting transducer 475 is conveyed through the conduits 445a and 445b to the acoustic receiving transducer 461 positioned at the pressurized air source 480. The acoustic receiving transducer 461 is coupled to the receiver assembly 160 and the display 169, generally as discussed above with reference to FIGS. 2–4B. The receiver assembly 160 may also be coupled to the pressurized air source 480 to provide a feedback loop. Accordingly, the receiver assembly 160 may be connected to an electronic feedback device 469 to automatically control the pressurized air source 480, based on the signals received from the acoustic transmitting transducer 475, and provide a selected pressure in the cylinder 437.

An advantage of the apparatus 410 shown in FIG. 6 is that it may automatically adjust the force between the semiconductor substrate 112 and the polishing pad 127 based on measurements made by the pressure transducer 490. In other embodiments, similar feedback loops may be coupled to a heater to regulate the temperature of the semiconductor substrate 112, or to a chemical dispenser to regulate the pH of the planarizing solution 128 on the polishing pad 127. Another advantage of an embodiment of the invention shown in FIG. 6 is that some existing planarizing machines may include the air source 480 and the cylinder 437, allowing the wireless communication link to incorporate existing hardware.

Figure 7:
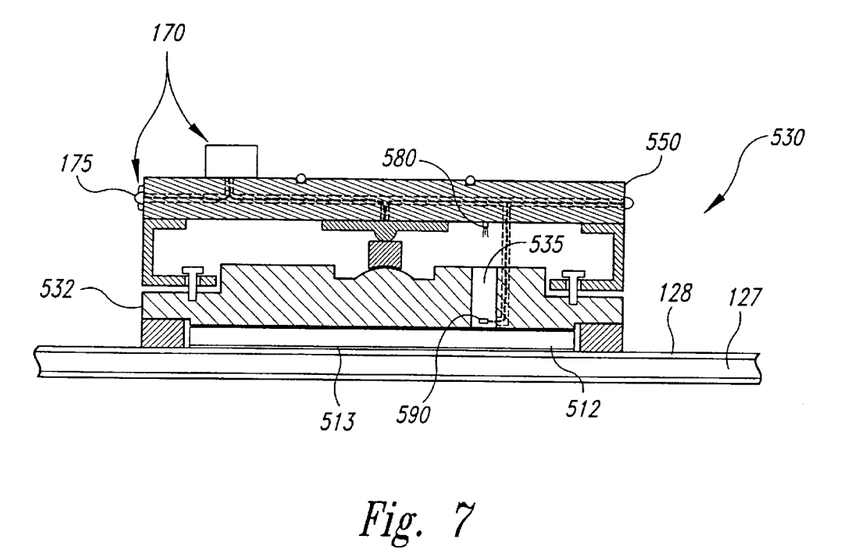
FIG. 7 is a partial cross-sectional elevation view of a carrier assembly in accordance with yet another embodiment of the invention.

FIG. 7 is a cross-sectional elevation view of a carrier assembly 530 having a light source 580 and a light detector, such as an electronic light detector 590, in accordance with another embodiment of the invention. As shown in FIG. 7, the light source 580 may be positioned in the mounting plate 550 above the engaging plate 532 to direct light through an aperture 535 in the engaging plate 532. The light passes through the aperture 535, through a transparent upper surface of a transparent substrate 512, and strikes a reflective coating 513 on the opposite side of the substrate 512. The reflected light passes back through the transparent upper surface of the substrate 512 where it is detected by the light detector 590. The surface of the detector 590 facing away from the substrate 512 may be shielded so that the detector receives reflected light rather than incident light. When the reflective layer 513 is completely removed, light no longer reflects therefrom, and the signal generated by the light detector 590 changes.

In one embodiment, the light source 580 generates visible light and the light detector 590 detects visible light. In other embodiments, the light source 580 and detector 590 operate at other wavelengths. In any case, signals generated by the detector 590 may be conveyed to the transmitter assembly 170 and then to the receiver assembly 160 (FIG. 2), as was discussed above with reference to FIGS. 2–4B.

In one embodiment, the transparent substrate 512 may have dimensions generally similar to those of a conventional semiconductor substrate (such as a silicon substrate) and the reflective layer 513 may have a hardness that is representative of the surface of the conventional semiconductor substrate. When the transparent substrate 512 is planarized, the reflective layer 513 may accordingly be removed at a rate similar to the rate at which material is removed from a conventional semiconductor wafer surface. Accordingly, the carrier assembly 530 and transparent substrate 512 may be used to calibrate the apparatus 110 (FIG. 2) by simulating conditions under which an actual semiconductor substrate is planarized.

Figure 8:
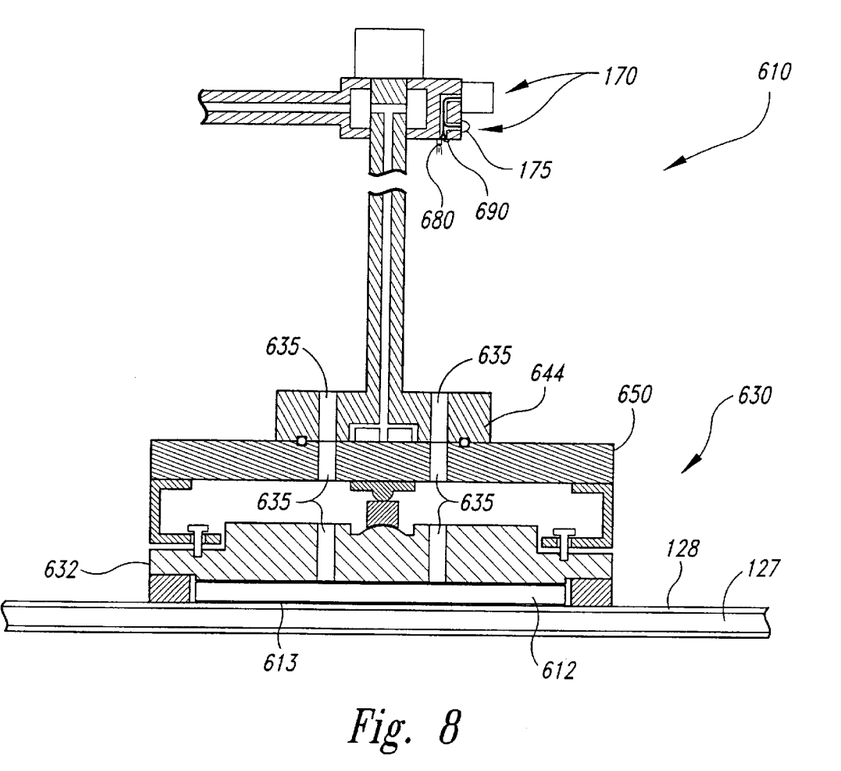
FIG. 8 is a partial cross-sectional elevation view of a portion of an apparatus engaging a substrate in accordance with still another embodiment of the invention.

FIG. 8 is a cross-sectional elevation view of an apparatus 610 having a non-rotating light source 680 and light detector 690 in accordance with another embodiment of the invention. As shown in FIG. 8, the light source 680 and the detector 690 are positioned above the carrier assembly 630. Accordingly, the coupling plate 644, mounting plate 650, and engaging plate 632 are each provided with a plurality of apertures 635 to allow the light generated by the light source 680 to illuminate the substrate 612 and reflect from the reflective layer 613 upward to the detector 690, as was discussed above with reference to FIG. 7.

Figure 9:
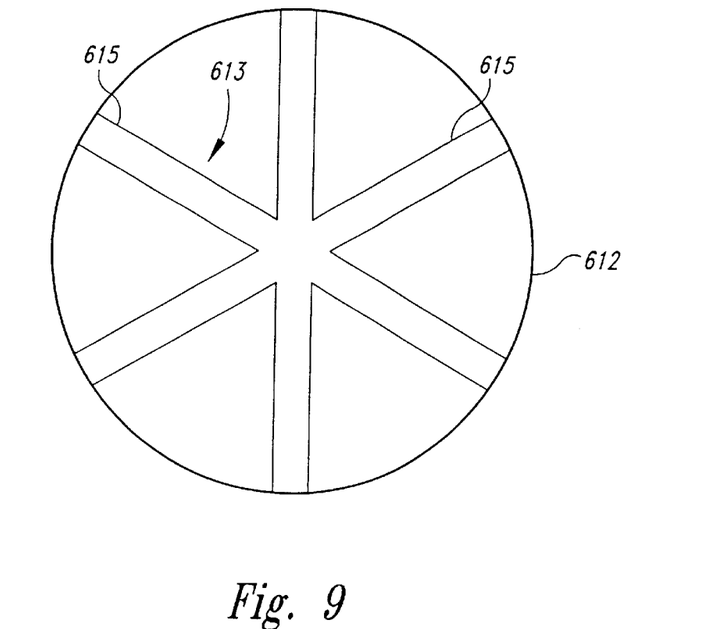
FIG. 9 is a top plan view of the substrate shown in FIG. 8.

FIG. 9 is a top plan view of the substrate 612 shown in FIG. 8. As shown in FIG. 9, the reflective layer 613 on the surface of the substrate 612 may include a plurality of radial segments 615, each aligned with one or more of the apertures 635 (FIG. 8). Accordingly, an advantage of the apparatus 610 and substrate 612 shown in FIGS. 8 and 9 is that the light detector 690 may detect light reflected from a variety of positions on the substrate 612 as the substrate rotates relative to the light detector. This is advantageous because it may indicate areas of the substrate 612 that planarize at different rates.

Figure 10:
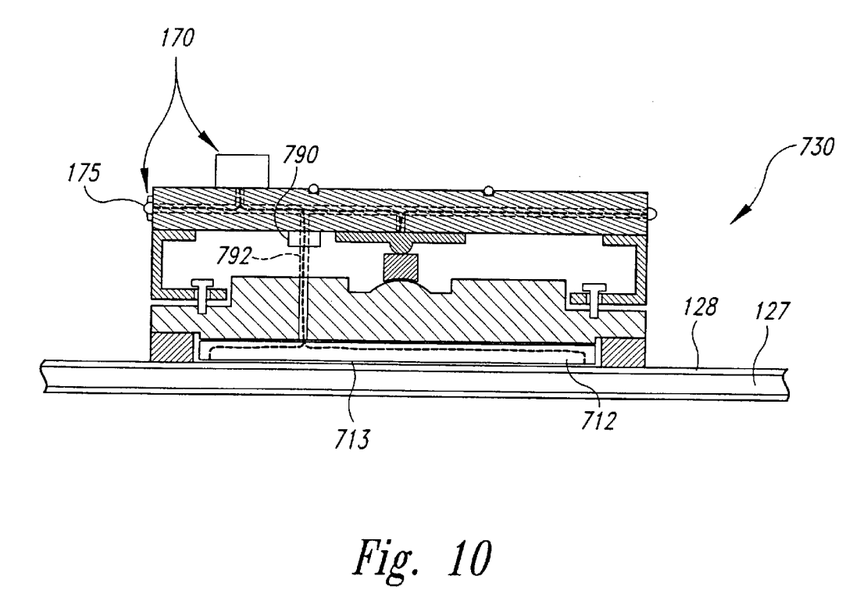
FIG. 10 is a partial cross-sectional elevation view of a carrier assembly in accordance with another embodiment of the invention.

FIG. 10 is a partial cross-sectional elevation view of a carrier 730 and a substrate 712 in accordance with yet another embodiment of the invention. In one aspect of this embodiment, the substrate 712 includes an electrically conductive layer 713 facing the polishing pad 127. The conductive layer 713 is connected with leads 792 to an ohm meter 790 that measures the resistance of the conductive layer 713. During planarization, the thickness of the conductive layer 713 is gradually reduced, altering the resistance of the conductive layer. The change in resistance is detected by the ohm meter 790, and may be used to indicate when planarization is complete or when various planarizing parameters, such as temperature and pressure, are either too great, creating too high a rate of planarization, or too small, creating too low a rate of planarization.

As shown in FIG. 10, the conductive leads 792 may connect to the planarized surface of the substrate 712. In another embodiment, the conductive leads 792 may be coupled to vias that are integrally formed with the substrate 712 and that extend between the leads 792 and the conductive layer 713. In still a further aspect of this embodiment, the conductive layer 713 may include the outer surface of a conventional semiconductor substrate.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus for transmitting signals from a planarizing device, the planarizing device having a support, a platen assembly connected to the support, and a carrier movable relative to the platen assembly and the support to remove material from a semiconductor substrate positioned between the carrier and the platen assembly, the apparatus comprising:

a force sensor connected to the carrier, the sensor generating a signal corresponding to a force exerted against the substrate by the carrier;

an electronic device spaced apart from the sensor; and a wireless communication link coupled between the sensor and the electronic device to transmit the signal from the sensor to the electronic device, wherein the communication link comprises at least one transmitting transducer coupled to a transmitter and attached to the carrier, the communication link further including a receiving transducer spaced apart from the transmitting transducer, the transmitting transducer moving relative to the receiving transducer while the semiconductor substrate is planarized.

2. The apparatus of claim 1 wherein the electronic device includes a display.

3. The apparatus of claim 1 wherein the electronic device includes a feedback device to change the value of the force exerted against the substrate by the carrier.

4. The apparatus of claim 1 wherein the carrier comprises a mounting member removably coupled to the support and an engaging member to engage the semiconductor substrate, the force sensor being connected between the mounting member and the engaging member to measure a force transmitted therebetween.

5. The apparatus of claim 1 wherein the force sensor includes a steady state force sensor.

6. The apparatus of claim 1 wherein the force sensor is configured to measure a varying force.

7. The apparatus of claim 1 wherein the display is generally fixed relative to the support.

8. The apparatus of claim 1 wherein the communication link includes at least one radio transmitting transducer attached to the carrier, the communication link further including a radio receiving transducer spaced apart from the radio transmitting transducer, the radio transmitting transducer moving relative to the radio receiving transducer while the semiconductor substrate is planarized.

9. The apparatus of claim 1, wherein the communication link includes a transmitting transducer attached to the carrier, the communication link further including a receiving transducer spaced apart from the transmitting transducer, the transmitting transducer being movable relative to the receiving transducer while the semiconductor substrate is planarized, further comprising a controller coupled to the planarizing device to change the force exerted against the substrate by the carrier when the value differs from a selected value.

10. The apparatus of claim 9 wherein the controller includes a force controller coupled to the carrier to vary the force on the semiconductor substrate.

11. The apparatus of claim 1, further comprising a power supply attached to the carrier and coupled to the sensor to supply power thereto.

12. The apparatus of claim 1 wherein the communication link includes a plurality of wireless transmitting transducers connected to the sensor and at least one wireless receiver spaced apart from the wireless transmitting transducers, the wireless transmitting transducers moving relative to the wireless receiving transducer when the semiconductor substrate is planarized.

13. The apparatus of claim 1 wherein the signal is an analog signal and the communication link includes a wireless analog transmitting transducer and a wireless analog receiving transducer spaced apart from the wireless analog transmitting transducer.

14. The apparatus of claim 1 wherein the signal is a digital signal and the communication link includes a wireless digital transmitting transducer and a wireless digital receiving transducer spaced apart from the wireless digital transmitting transducer.

15. The apparatus of claim 1, further comprising a memory device coupled to the sensor to receive the sensor signal and store the sensor signal for a selected period of time.

16. An apparatus for transmitting wireless signals from a planarizing device, the planarizing device having a support, a platen, and a carrier movable relative to the support and the platen to planarize a semiconductor substrate engaged by the carrier as the carrier moves relative to the platen, the apparatus comprising:

a force sensor coupled to the carrier to generate a sensor signal corresponding to a value of a force exerted against the substrate by the carrier;

a wireless transmitter coupled to at least one transmitting transducer, the transmitter being configured to receive a signal generated by the sensor and to transmit a wireless transmitter signal through the at least one transmitting transducer; and a wireless receiver spaced apart from the wireless transmitter to receive the transmitter signal, the wireless receiver being generally fixed relative to the support.

17. The apparatus of claim 16 wherein the wireless transmitter includes a frequency modulating transducer.

18. The apparatus of claim 16 wherein the wireless transmitter includes an amplitude modulating transducer.

19. The apparatus of claim 16 wherein the transmitter includes a radio transmitting transducer and the receiver includes a radio receiving transducer.

20. The apparatus of claim 16, further comprising a memory device coupled to the sensor to receive the sensor signal and store the sensor signal for a selected period of time.

* * * * *